United States Patent
Kawamoto

(10) Patent No.: US 9,105,603 B2
(45) Date of Patent: Aug. 11, 2015

(54) LAMINATE TYPE SEMICONDUCTOR CERAMIC CAPACITOR WITH VARISTOR FUNCTIONALITY AND METHOD FOR MANUFACTURING THE SAME

(71) Applicant: MURATA MANUFACTURING CO. LTD., Nagaokakyo-shi, Kyoto-fu (JP)

(72) Inventor: Mitsutoshi Kawamoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/228,368

(22) Filed: Mar. 28, 2014

(65) Prior Publication Data

US 2014/0210048 A1    Jul. 31, 2014

Related U.S. Application Data

(63) Continuation of application No. PCT/JP2012/076665, filed on Oct. 16, 2012.

(30) Foreign Application Priority Data

Oct. 20, 2011    (JP) ................... 2011-230752

(51) Int. Cl.
*H01L 29/94*    (2006.01)
*H01L 27/108*    (2006.01)
(Continued)

(52) U.S. Cl.
CPC ............. *H01L 28/40* (2013.01); *B82Y 30/00* (2013.01); *C04B 35/47* (2013.01); *C04B 35/62685* (2013.01); *H01C 7/1006* (2013.01); *H01C 7/18* (2013.01); *H01C 17/06533* (2013.01); *H01G 4/1227* (2013.01); *H01G 4/30* (2013.01); *H01L 28/82* (2013.01); *C04B 2235/3224* (2013.01);
(Continued)

(58) Field of Classification Search
CPC ............. H01G 4/12; H01G 4/30; H01L 28/40
USPC ............................ 257/306, 307; 438/382, 624
See application file for complete search history.

(56) References Cited

U.S. PATENT DOCUMENTS 7,583,493 B2 *    9/2009    Tani et al. ................... 361/321.4
7,872,854 B2 *    1/2011    Kawamoto ................ 361/321.1
(Continued)

FOREIGN PATENT DOCUMENTS

JP    S59-208807 A    11/1984
JP    H01-289206 A    11/1989
(Continued)

OTHER PUBLICATIONS

PCT/JP2012/076665C Written Opinion dated Jan. 10, 2013.
(Continued)

*Primary Examiner* — Nicholas Tobergte
(74) *Attorney, Agent, or Firm* — Arent Fox LLP

(57) ABSTRACT

A semiconductor ceramic having a compounding molar ratio m between a Sr site and a Ti site that satisfies $1.000 \leq m \leq 1.020$, has a donor element present as a solid solution in crystal grains, has an acceptor element present in a grain boundary layer in the range of 0.5 mol or less with respect to 100 mol of the Ti element, contains a Zr element in the range of 0.15 mol or more and 3.0 mol or less with respect to 100 mol of the Ti element, and has the crystal grains of 1.5 μm or less in average grain size.

19 Claims, 3 Drawing Sheets

(51) Int. Cl.
   *H01L 21/20* (2006.01)
   *H01L 49/02* (2006.01)
   *H01G 4/30* (2006.01)
   *H01C 7/10* (2006.01)
   *H01C 7/18* (2006.01)
   *H01C 17/065* (2006.01)
   *C04B 35/47* (2006.01)
   *C04B 35/626* (2006.01)
   *B82Y 30/00* (2011.01)
   *H01G 4/12* (2006.01)

(52) U.S. Cl.
   CPC . *C04B 2235/3227* (2013.01); *C04B 2235/3241* (2013.01); *C04B 2235/3244* (2013.01); *C04B 2235/3251* (2013.01); *C04B 2235/3262* (2013.01); *C04B 2235/3267* (2013.01); *C04B 2235/3275* (2013.01); *C04B 2235/3279* (2013.01); *C04B 2235/3418* (2013.01); *C04B 2235/441* (2013.01); *C04B 2235/5409* (2013.01); *C04B 2235/5454* (2013.01); *C04B 2235/6582* (2013.01); *C04B 2235/785* (2013.01); *C04B 2235/786* (2013.01); *C04B 2235/79* (2013.01); *C04B 2235/85* (2013.01); *H01G 4/12* (2013.01)

(56) References Cited

U.S. PATENT DOCUMENTS

| | | | |
|---|---|---|---|
| 8,040,658 B2* | 10/2011 | Kawamoto | 361/321.1 |
| 8,237,151 B2* | 8/2012 | Lochtefeld | 257/13 |
| 8,654,506 B2* | 2/2014 | Kawamoto | 361/321.4 |
| 2008/0117561 A1 | 5/2008 | Tani et al. | |

FOREIGN PATENT DOCUMENTS

| | | |
|---|---|---|
| JP | H03-165018 A | 7/1991 |
| JP | 2002-134350 A | 5/2002 |
| WO | WO-2008/004389 A1 | 1/2008 |

OTHER PUBLICATIONS

PCT/JP2012/076665C ISR dated Jan. 10, 2013.
Japanese Office Action dated Mar. 12, 2015 issued for counter application JP2013-539642 and English translation attached.

* cited by examiner

LAMINATE TYPE SEMICONDUCTOR CERAMIC CAPACITOR WITH VARISTOR FUNCTIONALITY AND METHOD FOR MANUFACTURING THE SAME

CROSS REFERENCE TO RELATED APPLICATIONS

The present application is a continuation of International application No. PCT/JP2012/076665, filed Oct. 16, 2012, which claims priority to Japanese Patent Application No. 2011-230752, filed Oct. 20, 2011, the entire contents of each of which are incorporated herein by reference.

FIELD OF THE INVENTION

The present invention relates to a laminate type semiconductor ceramic capacitor with varistor functionality and a method for manufacturing the capacitor, and more particularly relates to a laminated semiconductor ceramic capacitor with varistor functionality, which uses a $SrTiO_3$ based grain boundary insulated semiconductor ceramic, and a method for manufacturing the capacitor.

BACKGROUND OF THE INVENTION

In recent years, with the development of electronics technology, mobile electronic devices such as cellular phones and laptop personal computers, and in-car electronic devices to be installed on cars have becoming common, and the reduction in size with multiple functions has been required for the electronic devices.

On the other hand, in order to achieve the reduction in size with multiple functions for the electronic devices, more semiconductor elements have been used such as various types of ICs and LSI, and accordingly, the electronic devices have been decreasing their noise immunity.

Thus, conventionally, power lines for various types of ICs and LSI are provided with a film capacitor, a laminate type ceramic capacitor, a semiconductor ceramic capacitor, or the like as a bypass capacitor, to thereby ensure the noise immunity for the electronic devices.

In particular, in the case of car navigation systems, car audio systems, in-car ECUs, etc., what is commonly the case is that a capacitor with an electrostatic capacitance on the order of 1 nF is connected to an external terminal, to thereby absorb high-frequency noises.

However, while these capacitors exhibit superior performance on the absorption of high-frequency noises, the capacitors themselves have no function of absorbing high-voltage pulses or static electricity. For this reason, if the high-voltage pulses or static electricity are input to the electronic devices, there is a possibility that the high-voltage pulses or static electricity may cause the electronic device to malfunction or cause the semiconductor elements to be broken. In particular, a lowered electrostatic capacitance on the order of 1 nF makes the ESD (Electro-Static Discharge) withstanding voltage extremely low (for example, on the order of 2 kV to 4 kV), thereby possibly leading to breakdown of the capacitor itself.

Thus, conventionally, as shown in FIG. 2(a), a zener diode 105 is provided in parallel to a capacitor 104 connected to a power line 103 for connecting an external terminal 101 and an IC 102, or as shown in FIG. 2(b), a varistor 106 is provided in parallel to the capacitor 104, thereby ensuring an ESD withstanding voltage.

However, when the zener diode 105 or the varistor 106 is provided in parallel to the capacitor 104 as described above, the number of components is increased to cause an increase in cost, moreover, the space for the placement of the components has to be ensured, and there is thus a possibility that an increase in the size of the device may be caused.

Therefore, if the capacitor is allowed to have a varistor function, the need for the zener diode or the varistor will be eliminated, and the ESD withstanding voltage can also be handled by only the capacitor as shown in FIG. 3, thereby making it easier to standardize the design, and thus allowing a value-added capacitor to be provided.

Furthermore, Patent Document 1 proposes a laminate type semiconductor ceramic capacitor with varistor functionality, in which a semiconductor ceramic is formed of a $SrTiO_3$ based grain boundary insulated type, the compounding molar ratio m between the Sr site and the Ti site satisfies $1.00 < m \leq 1.020$, a donor element is present as a solid solution in crystal grains, an acceptor element is present in a grain boundary layer in the range of 0.5 mol or less (excluding 0 mol) with respect to 100 mol of the Ti element, and the crystal grains have an average grain size of 1.0 µm or less.

According to this Patent Document 1, the semiconductor ceramic which has the composition described above allows a laminate type grain boundary insulated semiconductor ceramic capacitor with varistor functionality to be achieved which provides favorable insulation properties, has a favorable ESD withstanding voltage, and allows the reduction in layer thickness and the reduction in size.

Patent Document 1: International Publication WO 2008/004389

SUMMARY OF THE INVENTION

However, while the laminate type semiconductor ceramic capacitor with varistor functionality in Patent Document 1 has an ESD withstanding voltage of 30 kV or more and favorable insulation properties with a specific resistance log ρ of 9.7 or more, the capacitor has a problem that a lowered electrostatic capacitance on the order of 1 nF causes great variability in insulation performance, thereby resulting in a decrease in product yield, and thus in inferior productivity.

The present invention has been made in view of these circumstances, and an object of the present invention is to provide a $SrTiO_3$ based grain boundary insulated laminate type semiconductor ceramic capacitor with varistor functionality, which allows for an improvement in product yield while ensuring such insulation performance that can withstand the practical use, and is suitable for mass production with a favorable ESD withstanding voltage.

The inventor has carried out earnest studies on $SrTiO_3$ based grain boundary insulated semiconductor ceramics to achieve the above object, and found that the compounding molar ratio m between the Sr site and the Ti site is adjusted so that the compounding molar ratio m between the Sr site and the Ti site falls within $1.000 \leq m \leq 1.020$, and furthermore, the addition of a Zr element in the range of 0.15 mol to 3.0 mol with respect to 100 mol of a Ti element along with a predetermined amount of acceptor element and the application of a heat treatment allows for an improvement in product yield while ensuring such insulation performance that can withstand the practical use, and can achieve a favorable ESD withstanding voltage.

The present invention has been achieved on the basis of this finding, and a laminate type semiconductor ceramic capacitor with varistor functionality (hereinafter, simply referred to as a "laminate type semiconductor ceramic capacitor") according to the present invention includes: a laminated sintered body obtained by alternately stacking and firing a plurality of semiconductor ceramic layers formed from a $SrTiO_3$ based grain boundary insulated semiconductor ceramic and a plurality of internal electrode layers; and external electrodes on both ends of the laminated sintered body, the external electrodes electrically connected to the internal electrode layers, and in the laminate type semiconductor ceramic capacitor, the semiconductor ceramic characteristically has a compounding molar ratio m between the Sr site and the Ti site to satisfy $1.000 \leq m \leq 1.020$, has a donor element present as a solid solution in crystal grains, has an acceptor element present in a grain boundary layer in the range of 0.5 mol or less (excluding 0 mol) with respect to 100 mol of the Ti element, contains a Zr element in the range of 0.15 mol or more and 3.0 mol or less with respect to 100 mol of the Ti element, and has the crystal grains of 1.5 μm or less in average grain size.

In addition, in order to ensure more favorable electrical properties and insulation properties while ensuring a desired ESD withstanding voltage, the acceptor element is preferably contained in the range of 0.3 mol to 0.5 mol with respect to 100 mol of the Ti element.

More specifically, the laminate type semiconductor ceramic capacitor according to the present invention preferably contains the acceptor element in the range of 0.3 mol to 0.5 mol with respect to 100 mol of the Ti element.

In addition, the laminate type semiconductor ceramic capacitor according to the present invention has the acceptor element preferably containing at least one element of Mn, Co, Ni, and Cr.

In addition, the laminate type semiconductor ceramic capacitor according to the present invention has the donor element preferably containing at least one element of La, Nd, Sm, Dy, Nb, and Ta.

In addition, the laminate type semiconductor ceramic capacitor according to the present invention preferably contains a low-melting point oxide in the range of 0.1 mol or less with respect to 100 mol of the Ti element.

Moreover, in the laminate type semiconductor ceramic capacitor according to the present invention, the low-melting point oxide is preferably $SiO_2$.

In addition, a method for manufacturing a laminate type semiconductor ceramic capacitor according to the present invention is a method for manufacturing a laminate type semiconductor ceramic capacitor with varistor functionality, with the use of a $SrTiO_3$ based grain boundary insulated semiconductor ceramic, and the method characteristically includes: a calcined powder preparation step of preparing a calcined powder in such a way that a ceramic raw material containing a donor compound is weighed so that the compounding molar ratio m between the Sr site and the Ti site falls within the range of $1.000 \leq m \leq 1.020$, and subjected to mixing and grinding, and then to a calcination treatment; a heat-treated powder preparation step of preparing a heat-treated powder in such a way that an acceptor compound is weighed for 0.5 mol or less (excluding 0 mol) with respect to 100 mol of the Ti element, whereas a Zr compound is weighed for 0.15 mol or more and 3.0 mol or less with respect to 100 mol of the Ti element, and the Zr compound and the acceptor compound mixed with the calcined powder are subjected to a heat treatment; a laminated body forming step of forming a laminated body in such a way that the heat-treated powder is subjected to shape forming to prepare ceramic green sheets, and internal electrode layers and the ceramic green sheets are then alternately stacked; and a firing step of subjecting the laminated body to a primary firing treatment in a reducing atmosphere, and then to a secondary firing treatment in a weakly reducing atmosphere, in the atmosphere, or in an oxidizing atmosphere.

In addition, in the method for manufacturing a laminate type semiconductor ceramic capacitor according to the present invention, the calcination temperature in the calcination treatment is preferably higher than the firing temperature in the primary firing treatment.

In the laminate type semiconductor ceramic capacitor according to the present invention, the semiconductor ceramic forming the semiconductor ceramic layers has a compounding molar ratio m between the Sr site and the Ti site to satisfy $1.000 \leq m \leq 1.020$, has a donor element present as a solid solution in the crystal grains, has an acceptor element present in the grain boundary layer in the range of 0.5 mol or less (excluding 0 mol) with respect to 100 mol of the Ti element, contains a Zr element in the range of 0.15 mol or more and 3.0 mol or less with respect to 100 mol of the Ti, and has the crystal grains of 1.5 μm or less in average grain size. Thus, even with the compounding molar ratio m between the Sr site and the Ti site in accordance with the stoichiometric ratio, or with the Sr site in excess of the stoichiometric ratio, a laminate type semiconductor ceramic capacitor can be achieved which allows for an improvement in product yield while ensuring such insulation performance that can withstand the practical use adequately, and is suitable for mass production with a favorable ESD withstanding voltage.

Specifically, the present invention allows a laminate type semiconductor ceramic capacitor to be achieved which has an ESD withstanding voltage of 30 kV or more, can ensure an insulation resistance log IR of 8.5 or more, has a product yield of 85% or more, and is suitable for mass production with favorable reliability, even when the electrostatic capacitance is lowered to on the order of 1 nF.

In addition, the method for manufacturing a laminate type semiconductor ceramic capacitor according to the present invention is the method for manufacturing a laminate type semiconductor ceramic capacitor with varistor functionality, with the use of a $SrTiO_3$ based grain boundary insulated semiconductor ceramic, and the method includes: the calcined powder preparation step of preparing a calcined powder in such a way that a ceramic raw material containing a donor compound is weighed so that the compounding molar ratio m between the Sr site and the Ti site falls within the range of $1.000 \leq m \leq 1.020$, and subjected to mixing and grinding, and then to a calcination treatment; the heat-treated powder preparation step of preparing a heat-treated powder in such a way that an acceptor compound is weighed for 0.5 mol or less (excluding 0 mol) with respect to 100 mol of the Ti element, whereas a Zr compound is weighed for 0.15 mol or more and 3.0 mol or less with respect to 100 mol of the Ti element, and the Zr compound and the acceptor compound mixed with the calcined powder are subjected to a heat treatment; the laminated body forming step of forming a laminated body in such a way that the heat-treated powder is subjected to shape forming to prepare ceramic green sheets, and internal electrode layers and the ceramic green sheets are then alternately stacked; and the firing step of subjecting the laminated body to a primary firing treatment in a reducing atmosphere, and then to a secondary firing treatment in a weakly reducing atmosphere, in the atmosphere, or in an oxidizing atmosphere. Thus, even when the compounding molar ratio m between the Sr site and the Ti site falls within the range of $1.000 \leq m \leq 1.020$, a laminate type semiconductor ceramic capacitor which is favorable in product yield, has such insulation performance that can withstand the practical use adequately, and is suitable for mass production with a favorable ESD withstanding voltage can be manufactured by carrying out a heat treatment with the addition of the Zr compound in the heat-treated powder preparation step.

DETAILED DESCRIPTION OF THE INVENTION

Next, an embodiment of the present invention will be described in detail.

Figure 1:
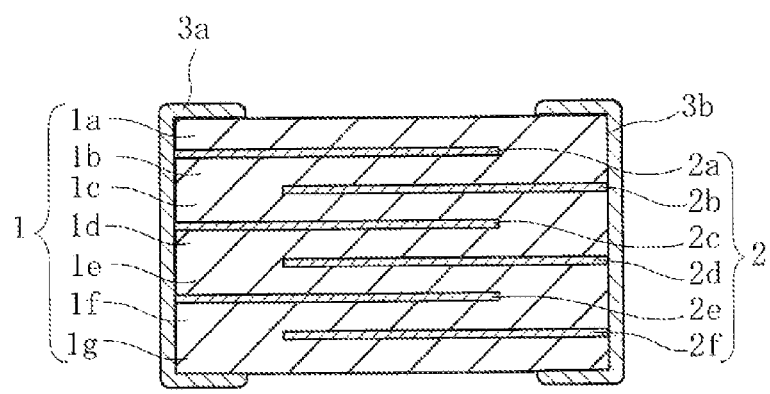
FIG. 1 is a cross-sectional view schematically illustrating an embodiment of a laminate type semiconductor ceramic capacitor according to the present invention.
Figure 2A:
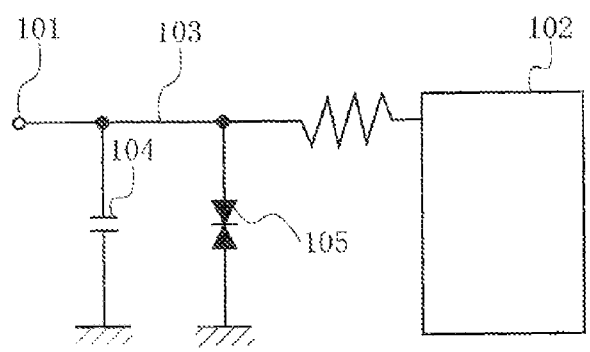
FIGS. 2(a) and 2(b) are electric circuit diagrams in the case of a zener diode or a varistor provided in parallel to a capacitor.
Figure 2B:
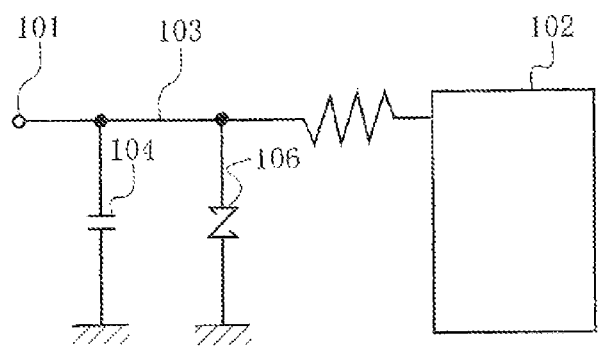
Figure 3:
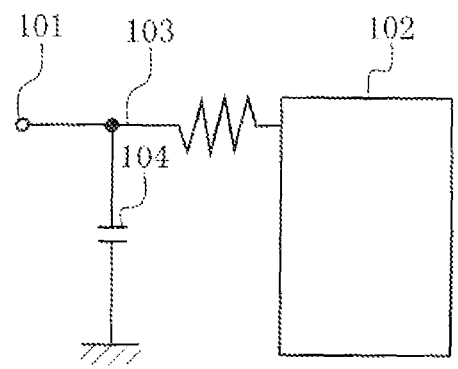
FIG. 3 is an electric circuit diagram in the case of providing a capacitor with varistor functionality.

FIG. 1 is a cross-sectional view schematically illustrating an embodiment of a laminate type semiconductor ceramic capacitor according to the present invention.

The laminate type semiconductor ceramic capacitor includes a component body 1 and external electrodes 3a and 3b formed on both ends of the component body 1.

The component body 1 including a laminated sintered body with a plurality of semiconductor ceramic layers 1a to 1g and a plurality of internal electrode layers 2a to 2f stacked alternately and subjected to firing, and the internal electrode layers 2a, 2c, and 2e are exposed at one end surface of the component body 1 and electrically connected to the external electrodes 3a, whereas the other internal electrode layers 2b, 2d, and 2f are exposed at the other end surface of the component body 1 and electrically connected to the other external electrode 3b.

The semiconductor ceramic layers 1a to 1g including a plurality of semiconductor crystal grains and a grain boundary layer formed around the crystal grains in the microscopic sense (not shown), and the crystal grains form electrostatic capacitance with the grain boundary layer interposed therebetween. Furthermore, these crystal grains are connected in series with or in parallel to each other between the opposed surfaces of the internal electrode layers 2a, 2c, and 2e and of the internal electrode layers 2b, 2d, and 2f to provide a desired electrostatic capacitance as a whole.

The semiconductor ceramic layers 1a to 1g described above are formed from a $SrTiO_3$ based grain boundary insulated semiconductor ceramic. Furthermore, the semiconductor ceramic has a compounding molar ratio m between Sr site and Ti site (=Sr site/Ti site) to satisfy $1.000 \leq m \leq 1.020$, has a donor element present as a solid solution in the crystal grains, has an acceptor element present in the grain boundary layer in the range of 0.5 mol or less (excluding 0 mol) with respect to 100 mol of the Ti element, contains an Zr element in the range of 0.15 mol or more and 3.0 mol or less with respect to 100 mol of the Ti element, and has the crystal grains of 1.5 μm or less in average grain size.

This semiconductor ceramic allows a laminate type semiconductor ceramic capacitor with varistor functionality to be achieved which is able to make an improvement in product yield while ensuring such insulation performance that can withstand the practical use adequately, and suitable for mass production with a favorable ESD withstanding voltage.

Next, the reasons for specifying the compounding molar ratio m and the molar contents of the acceptor element and Zr element in the ranges described above will be described in detail.

(1) Compounding Molar Ratio m

The excessive molar content of the Sr site over the stoichiometric composition (=1.000) allows coarsening of the crystal grains to be suppressed, and allows the insulation resistance to be prevented from decreasing. More specifically, the excessive addition of Sr over the stoichiometric composition causes Sr deposited in the grain boundary layer, rather than present as a solid solution in the crystal grains, to suppress the grain growth, thereby providing fine crystal grains. Furthermore, these fine crystal grains are believed to make oxygen likely to reach the grain boundary layer and to promote the formation of a Schottky barrier, thereby allowing the insulation resistance to be prevented from decreasing.

In addition, in the case of the compounding molar ratio m in accordance with the stoichiometric composition, though slight coarsening of the crystal grains is caused because the grain boundary layer has therein no substance for suppressing grain growth of the ceramic, allowing the average grain size to be reduced to 1.5 μm or less while ensuring practically sufficient insulation performance.

On the other hand, the compounding molar ratio m greater than 1.020 excessively produces Sr deposited in the grain boundary layer, rather than present as a solid solution in the crystal grains, thereby making it difficult to improve the product yield even when the Zr element is contained as described later.

Thus, the preparation is made so that the compounding molar ratio m falls within $1.000 \leq m \leq 1.020$ in the present embodiment.

(2) Molar Content of Acceptor Element

The presence of the acceptor element in the grain boundary layer causes the grain boundary layer to form an electrically activated energy level (grain boundary level) to promote the formation of a Schottky barrier, thereby improving the insulation resistance, and thus allowing the achievement of a laminate type semiconductor ceramic capacitor which has favorable insulation properties.

However, when the molar content of the acceptor element is greater than 0.5 mol with respect to 100 mol of the Ti element, a decrease in ESD withstanding voltage will be unfavorably caused.

Thus, in the present embodiment, the acceptor element is contained in the range of 0.5 mol or less (however, excluding 0 mol) with respect to 100 mol of the Ti element for improving insulation properties, so as to keep the ESD from being decreased.

It is to be noted that in order to achieve desired electrostatic capacitance and favorable insulation properties (insulation resistance) while ensuring a desired ESD withstanding voltage, the acceptor element is preferably contained in the range of 0.3 mol to 0.5 mol with respect to 100 mol of the Ti element.

Further, this acceptor element is not to be considered particularly limited as long as the element acts as an acceptor, Mn, Co, Ni, Cr, etc. can be used, and in particular, Mn is preferably used.

(3) Molar Content of Zr Element

As described above, the compounding molar ratio m within $1.000 \leq m \leq 1.020$ as described above can achieve fine grains of 1.5 μm or less in average crystal grain size, while there is a possibility that this compounding molar ratio m will cause a decrease in product yield.

More specifically, in the case of the molar content of the Sr site in accordance with or in excess of the stoichiometric composition, the mass production of an article with a lowered electrostatic capacitance on the order of 1 nF causes great variability in insulation performance among products, thereby resulting in a decrease in product yield, and thus in inferior productivity. This is believed to be because Sr deposited in the grain boundary layer rather than present as a solid solution in the crystal grains, slightly interferes with the achievement of insulated crystal grain boundaries, and becomes significant with the increase in compounding molar ratio m.

Thus, in the present embodiment, the product yield is improved by the Zr element contained at 0.15 mol or more and 3.0 mol or less with respect to 100 mol of the Ti element.

More specifically, from a research finding of the inventor, it has been found that even when the compounding molar ratio m of 1.000 or more results in deposition of Sr in the grain boundary layer rather than presence as a solid solution in the crystal grains, the addition of the Zr element and the application of a heat treatment improve the product yield as long as the compounding molar ratio m is 1.020 or less. This is believed to be because the addition of the Zr element to the calcined powder and the application of the heat treatment cause segregation of Zr in the grain boundary layer, thereby allowing the Zr to compensate for the Sr deposited in the grain boundary layer, and making it possible to prevent the Sr from interfering with the achievement of insulated grain boundaries. Zr is considered to have the action of compensation for Sr deposited in the grain boundary layer as described above, and this action makes it possible to improve the product yield.

Further, to that end, the molar content of the Zr element needs to be at least 0.15 mol with respect to 100 mol of the Ti element.

On the other hand, when the molar content of the Zr element is greater than 3.0 mol with respect to 100 mol of Ti, the amount of Sr is relatively decreased which is segregated in the grain boundary layer to contribute to the achievement of finer crystal grains, and as a result, coarsening of the crystal grains in average grain size significantly decreases the insulation properties, and moreover, decreases the ESD withstanding voltage.

Thus, the Zr element is contained to be 0.15 mol or more and 3.0 mol or less with respect to 100 mol of the Ti element in the present embodiment.

Further, the ceramic is brought into a semiconductor by allowing the donor element to be present as a solid solution in the crystal grains. More specifically, the donor element is allowed to be present as a solid solution in the crystal grains, in order to bring the ceramic into a semiconductor by carrying out a firing treatment in a reducing atmosphere, while the content of the donor element is not particularly limited. However, when the donor element is less than 0.2 mol with respect to 100 mol of the Ti element, there is a possibility that an excessive decrease in electrostatic capacitance may be caused. On the other hand, when the donor element is greater than 1.2 mol with respect to 100 mol of the Ti element, there is a possibility that the allowable temperature range may be narrowed for the firing temperature.

Therefore, the molar content of the donor element may be 0.2 mol to 1.2 mol, and preferably 0.4 mol to 1.0 mol with respect to 100 mol of the Ti element.

Furthermore, this donor element is not to be considered particularly limited, and for example, La, Nd, Sm, Dy, etc. can be used in the case of allowing the donor element to be present as a solid solution at the Sr site, whereas Nb, Ta, etc. can be used in the case of allowing the donor element to be present as a solid solution at the Ti site.

In addition, it is also preferable to add a low-melting point oxide into the semiconductor ceramic in the range of 0.1 mol or less with respect to 100 mol of the Ti element, and the addition of this low-melting point oxide can improve the sinterability, and promote the segregation of the acceptor element in the grain boundary layer.

It is to be noted that the molar content of the low-melting point oxide should fall within the range mentioned above, because the molar content in excess of 0.1 mol with respect to 100 mol of the Ti element may possibly lead to an excessive decrease in electrostatic capacitance, thereby resulting in a failure to achieve desired electrical characteristics.

In addition, the low-melting point oxide is not to be considered particularly limited, $SiO_2$, and glass ceramics containing B or an alkali metal element (such as K, Li, and Na), copper-tungsten salts, etc. can be used, while $SiO_2$ is preferably used.

It is to be noted that the average grain size for the crystal grains of the semiconductor ceramic can be easily controlled to 1.5 µm or less by controlling the manufacturing conditions such as the specific surface area of the Ti compound, the calcination temperature, and the firing temperature, in combination with the composition range described above.

In the present embodiment described above, the semiconductor ceramic forming the semiconductor ceramic layers 1a to 1g has a compounding molar ratio m between the Sr site and the Ti site to satisfy $1.000 \leq m \leq 1.020$, has a donor element such as La, Nd, Sm, Dy, Nb, and Ta present as a solid solution in the crystal grains, has an acceptor element such as Mn, Co, Ni, and Cr present in the grain boundary layer in the range of 0.5 mol or less (preferably 0.3 mol to 0.5 mol) with respect to 100 mol of the Ti element, contains the Zr element in the range of 0.15 mol to 3.0 mol with respect to 100 mol of the Ti element, and has the crystal grains of 1.5 µm or less in average grain size. Thus, a laminate type semiconductor ceramic capacitor can be achieved which allows for an improvement in product yield while ensuring such insulation performance that can withstand the practical use adequately, and is suitable for mass production with a favorable ESD withstanding voltage.

Specifically, the present invention allows a laminate type semiconductor ceramic capacitor to be achieved which has an ESD withstanding voltage of 30 kV or more, can ensure an insulation resistance log IR of 8.5 or more, has a product yield of 85% or more, and is suitable for mass production with favorable reliability, even when the electrostatic capacitance is lowered to on the order of 1 nF.

Next, an embodiment will be described with reference to a method for manufacturing the laminate type semiconductor ceramic capacitor.

First, as ceramic raw materials, a Sr compound such as $SrCO_3$, a donor compound containing a donor element such as La or Sm, and a fine Ti compound such as, for example, $TiO_2$ with a specific surface area of 10 $m^2$/g or more (average grain diameter: about 0.1 µm or less) are each prepared, and weighed in predetermined amounts.

Then, these weighed materials with a predetermined amount (for example, 1 to 3 parts by weight) of dispersant added thereto is put along with grinding media such as PSZ (Partially Stabilized Zirconia) balls and pure water into a ball mill, and subjected to sufficient wet mixing in the ball mill to prepare slurry.

Next, this slurry is evaporated to dryness, and then subjected to a calcination treatment for on the order of 2 hours at a predetermined temperature (for example, 1300° C. to 1450° C.) in the atmosphere to prepare a calcined powder with the donor elements present as a solid solution.

Then, a Zr compound is weighed so that the Zr element is 0.15 to 3.0 mol with respect to 100 mol of the Ti element, in addition, an acceptor compound is weighed so that the molar content of the acceptor element such as Mn or Co is 0.5 mol or less (preferably, 0.3 mol to 0.5 mol) with respect to 100 mol of the Ti element, and furthermore, a low-melting point oxide such as $SiO_2$ is weighed so that the molar content of the low-melting point-oxide is 0 to 0.1 mol with respect to 100 mol of the Ti element. Then, the Zr compound, the acceptor compound, and the low-melting point oxide, with the calcined powder and pure water, as well as a dispersant, if necessary, added thereto, are put again along with the grinding media into a ball mill, and mixed sufficiently in a wet way in the ball mill. Then, the mixture is thereafter subjected to evaporative drying, and to a heat treatment for on the order of 5 hours at a predetermined temperature (for example, 500° C. to 700° C.) in the atmosphere to prepare a heat-treated powder.

Next, this heat-treated powder, with an organic solvent such as toluene or alcohol, an organic binder, an antifoamer, a cationic surfactant, etc. added appropriately, is mixed sufficiently in a wet way, thereby providing a ceramic slurry.

Next, the ceramic slurry is subjected to shape forming with the use of a shape forming method such as a doctor blade method, a lip coater method, or a die coater method, to prepare ceramic green sheets so that the thickness after firing is a predetermined thickness (for example, on the order of 1 μm to 2 μm).

Then, a conductive paste for internal electrodes is used to carry out transfer or the like onto the ceramic green sheets with the use of a screen printing method, a gravure printing method, a vacuum deposition method, or a sputtering method, thereby forming a conductive film in a predetermined pattern on the surfaces of the ceramic green sheets.

It is to be noted that while the conductive material contained in the conductive paste for internal electrodes is not to be considered particularly limited, it is preferable to use a base metal material which has favorable electrical conductivity, such as Ni and Cu.

Then, the multiple ceramic green sheets with the conductive films formed thereon are stacked in a predetermined direction, followed by stacking ceramic green sheets for outer layers without any conductive films formed, then subjected to pressure bonding, and cut into a predetermined size to prepare a laminate.

Then, the laminate is thereafter subjected to a treatment for binder removal for on the order of 2 hours at a temperature of 300° C. to 500° C. in the atmosphere. Then, the laminate is subjected to primary firing at a temperature of 1200° C. to 1250° C. for on the order of 2 hours to be brought into a semiconductor in a firing furnace for use in a reducing atmosphere adjusted so that a $H_2$ gas and a $N_2$ have predetermined flow rates (for example, $H_2/N_2=1/1000$ to $1/100$).

When the calcination temperature (1300° C. to 1450° C.) in the calcination treatment is made higher than the firing temperature (1200° C. to 1250° C.) in the primary firing treatment as described above, the grain growth of crystal grain growth is hardly promoted in the primary firing treatment, so that the crystal grains can be prevented from coarsening. Furthermore, the calcination treatment can be controlled during the preparation of the calcined powder so that the crystal grains have an average grain size of 1.5 μm or less.

It is to be noted that when the average grain size for the crystal grains is desirably increased in the range of 1.5 μm or less during the primary firing treatment, it is possible to achieve the increased average grain size by setting the firing temperature for the primary firing treatment to a higher temperature in the range of 1200° C. to 1250° C.

In addition, even when the firing temperature for the primary firing treatment is made higher than the calcination temperature, it is possible to reduce the average grain size for the crystal grains to 1.5 μm or less by bringing the both temperatures close to each other as much as possible.

Then, after the laminate is brought into a semiconductor, the semiconductor is subjected to secondary firing at a low temperature of 600° C. to 900° C. for on the order of 1 hour in a weakly reducing atmosphere, in the atmosphere, or in an oxidizing atmosphere so that the internal electrode material such as Ni or Cu is not oxidized. Then, the semiconductor ceramic is subjected to reoxidation to form a grain boundary insulating layer, thereby preparing the component body 1 composed of a laminated sintered body with the internal electrodes 2 buried therein.

Next, a conductive paste for external electrodes is applied onto both ends of the component body 1, and subjected to a firing treatment to form the external electrodes 3a and 3b, thereby producing a laminate type semiconductor ceramic capacitor.

It is to be noted that as a method for forming the external electrodes 3a and 3b, the external electrodes 3a and 3b may be formed by printing, vacuum deposition, sputtering, or the like. In addition, the conductive paste for external electrodes may be applied onto the both ends of the unfired laminate, and then subjected to a firing treatment at the same time as the laminated body.

While the conductive material contained in the conductive paste for external electrodes is also not to be considered particularly limited, it is preferable to use a material such as Ga, In, Ni, and Cu, and further, it is also possible to form an Ag electrode on these electrodes.

In the present embodiment described above, the ceramic raw material containing the donor compound is weighed so that the compounding molar ratio m between the Sr site and the Ti site falls within the range of $1.000 \leq m \leq 1.020$, and subjected to mixing and grinding, and to the calcination treatment to prepare the calcined powder, and the Zr compound is then weighed to be 0.15 mol or more and 3.0 mol or less with respect to 100 mol of the Ti element, mixed with the calcined powder along with a predetermined amount of acceptor compound, and subjected to a heat treatment. Thus, even with the compounding molar ratio m between the Sr site and the Ti site in accordance with the stoichiometric ratio, or with the Sr site in excess of the stoichiometric ratio, a laminate type semiconductor ceramic capacitor can be achieved which allows for an improvement in product yield while ensuring such insulation performance that can withstand the practical use adequately, and is suitable for mass production with a favorable ESD withstanding voltage.

It is to be noted that the present invention is not to be considered limited to the embodiment described above. For example, while the solid solution is prepared by a solid phase method in the present embodiment, the method for preparing the solid solution is not to be considered particularly limited, and any methods can be used, such as, for example, a hydrothermal synthesis method, a sol-gel method, a hydrolysis method, and a coprecipitation method.

Next, an example of the present invention will be specifically described.

EXAMPLE

[Preparation of Samples]

$SrCO_3$ and $TiO_2$ with a specific surface area of 30 m$^2$/g (average grain size: about 30 nm) were prepared as ceramic raw materials, and $LaCl_3$, $SmCl_3$, and $NdCl_3$ were prepared as donor compounds. Then, the donor compounds were weighed for the contents of the donor elements as in Table 1 with respect to 100 mol of the Ti element, and further, $SrCO_3$ and $TiO_2$ were weighed for the compounding molar ratio m between the Sr site and the Ti site (=Sr site/Ti site) as in Table 1. Then, after adding 3 parts by weight of ammonium polycarboxylate as a dispersant to 100 parts by weight of these weighed materials, the mixture was put into a ball mill with PSZ balls of 2 mm in diameter as grinding media and pure water, and subjected to wet mixing for 16 hours in the ball mill to prepare a slurry.

Next, this slurry was subjected to evaporative drying, and then to a calcination treatment at a temperature of 1350° C. for 2 hours in the atmosphere to obtain a calcined powder with the donor elements present as a solid solution in crystal grains.

Next, to the calcined powder, $ZrO_2$ was added for the molar content of the Zr element with respect to 100 mol of the Ti element as in Table 1, $MnCO_3$ was added for the content of the Mn element with respect to 100 mol of the Ti element as in Table 1, $SiO_2$ was added so that the molar content of the $SiO_2$ was 0.1 mol with respect to 100 mol of the Ti element, and a dispersant was further added for 1 weight %. Then, the mixture was put into a ball mill again with PSZ balls of 2 mm in diameter and pure water, and mixed in a wet way for 16 hours in the ball mill. It is to be noted that a $MnCl_2$ aqueous solution or a $MnO_2$ sol may be used in place of $MnCO_3$. In addition, tetraethoxysilane ($Si(OC_2H_5)_4$) may be used in placed of $SiO_2$.

Then, the mixture was subjected to evaporative drying, and to a heat treatment at 600° C. for 5 hours in the atmosphere to obtain a heat-treated powder.

Next, the heat-treated powder with an organic solvent such as toluene or alcohol and a dispersant added in appropriate amounts was put again along with PSZ balls of 2 mm in diameter into a ball mill, and mixed in a wet way for 16 hours in the ball mill. Then, the mixture with polyvinyl butyral (PVB) as an organic binder, dioctyl phthalate (DOP) as a plasticizer, and further a cationic surfactant added thereto in appropriate amounts was subjected to a mixing treatment in a wet way for 1.5 hours, thereby preparing a ceramic slurry.

Next, this ceramic slurry was subjected to shape forming with the use of a lip coater method to prepare ceramic green sheets, and then, a conductive paste for internal electrodes, containing Ni as its main constituent, was used for application by screen printing onto the ceramic green sheets, thereby forming a conductive film in a predetermined pattern on the surfaces of the ceramic green sheets.

Then, the multiple ceramic green sheets with the conductive films formed thereon were stacked in a predetermined direction, followed by stacking ceramic green sheets for outer layers without any conductive films formed, then subjected to thermocompression bonding so as to provide a thickness on the order of 0.7 mm, thereby providing a laminate of the ceramic green sheets and internal electrodes stacked alternately.

Then, the laminate was thereafter subjected to a treatment for binder removal at a temperature of 375° C. for 2 hours in a nitrogen atmosphere, and then to primary firing at a temperature of 1250° C. for 2 hours in a reducing atmosphere at a flow ratio adjusted to $H_2:N_2=1:100$, thereby bringing the laminate into a semiconductor. It is to be noted that the firing temperature was set at a temperature leading to the maximum CR product for each sample.

Then, the laminate was subjected to a reoxidation treatment by carrying out secondary firing at a temperature of 700° C. for 1 hour in the atmosphere, and the end surfaces were then polished to prepare a component body (laminated sintered body). Then, sputtering was applied to both end surfaces of the component body to form external electrodes of three-layer structure composed of a Ni—Cr layer, a Ni—Cu layer, and an Ag layer. Then, electrolytic plating was applied to sequentially form a Ni film and a Sn film on the surfaces of the external electrodes, thereby preparing samples of sample numbers 1 to 19. It is to be noted that the obtained respective samples had external dimensions of length L: 1.0 mm, width W: 0.5 mm, and thickness T: 0.5 mm, and the number of layers stacked was 10.

[Evaluations of Samples]

Next, three samples for each of sample numbers 1 to 19 were encased in resin, and polished in the width direction for each sample to obtain a polished cross section at a point of about ½ in the width direction. Then, this polished cross section was subjected to chemical etching, and observed under a scanning electron microscope (SEM), and this SEM photograph was subjected to image analysis. Then, in conformity with the JIS (R1670), the average grain size for crystal grains was figured out in terms of equivalent circle diameter, and the average value for the three samples was calculated, and regarded as an average crystal grain size.

In addition, on 100 samples for each sample number, an impedance analyzer (HP4194A from Agilent Technologies Inc.) was used to measure the electrostatic capacitance under the conditions of frequency: 1 kHz and voltage: 1 V and figure out the average value for the 100 samples.

Furthermore, on 100 samples for each sample number, the ESD withstanding voltage was measured in such a way that positive and negative voltages were each applied 10 times for contact discharge in accordance with IEC 61000-4-2 (International Standard) of the ESD immunity test standard, and the average value was figured out for the 100 samples.

In addition, for 100 samples of each sample number, a direct-current voltage of 50 V was applied to each sample for 1 minute, and the insulation resistance IR of the sample was measured from the leakage current to obtain an average value for the 100 samples. Furthermore, for 100 samples of each sample number, the number of samples with an insulation resistance of 50 MΩ or more was counted to obtain the product yield (%).

Table 1 shows the compositions and measurement results for sample numbers 1 to 19. It is to be noted that for the insulation resistance IR, the average value is shown in common logarithm (log IR).

TABLE 1

| Sample No. | Compounding Molar Ratio m (—) | Donor Element Elemental Species | Donor Element Content (mol) | Mn (mol) | $ZrO_2$ (mol) | $SiO_2$ (mol) | Average Crystal Grain Size (μm) | Electrostatic Capacitance (nF) | ESD Withstanding Voltage (kV) | Insulation Resistance log IR (R: MΩ) | Product Yield (%) |
|---|---|---|---|---|---|---|---|---|---|---|---|
| 1* | 1.020 | La | 0.8 | 0.3 | 0 | 0.1 | 0.62 | 1.05 | 30 | 8.9 | 58 |
| 2* | 1.020 | La | 0.8 | 0.3 | 0.10 | 0.1 | 0.65 | 1.08 | 30 | 8.8 | 61 |

TABLE 1-continued

| Sample No. | Compounding Molar Ratio m (—) | Donor Element | | Mn Content (mol) | ZrO$_2$ (mol) | SiO$_2$ (mol) | Average Crystal Grain Size (μm) | Electrostatic Capacitance (nF) | ESD Withstanding Voltage (kV) | Insulation Resistance log IR (R: MΩ) | Product Yield (%) |
|---|---|---|---|---|---|---|---|---|---|---|---|
| | | Elemental Species | Content (mol) | | | | | | | | |
| 3 | 1.020 | La | 0.8 | 0.3 | 0.15 | 0.1 | 0.87 | 1.15 | 30 | 8.9 | 85 |
| 4 | 1.020 | La | 0.8 | 0.3 | 1.5 | 0.1 | 0.97 | 1.21 | 30 | 8.7 | 89 |
| 5 | 1.020 | La | 0.8 | 0.3 | 3.0 | 0.1 | 1.02 | 1.22 | 30 | 8.7 | 89 |
| 6* | 1.020 | La | 0.8 | 0.3 | 3.5 | 0.1 | 1.75 | 1.90 | 15 | 7.8 | 51 |
| 7* | 1.025 | La | 0.8 | 0.3 | 1.5 | 0.1 | 0.89 | 1.18 | 30 | 8.5 | 59 |
| 8* | 1.010 | La | 0.8 | 0.3 | 0 | 0.1 | 0.59 | 1.09 | 30 | 8.9 | 60 |
| 9 | 1.010 | La | 0.8 | 0.3 | 0.5 | 0.1 | 0.75 | 1.12 | 30 | 8.6 | 87 |
| 10* | 1.000 | La | 0.8 | 0 | 0.7 | 0.1 | 0.39 | 0.61 | 30 | 7.5 | 48 |
| 11* | 1.000 | La | 0.8 | 0.3 | 0 | 0.1 | 1.16 | 1.13 | 30 | 8.6 | 65 |
| 12 | 1.000 | La | 0.8 | 0.3 | 0.7 | 0.1 | 1.32 | 1.19 | 30 | 8.7 | 91 |
| 13 | 1.000 | La | 1.2 | 0.3 | 0.7 | 0.1 | 1.13 | 1.31 | 30 | 8.5 | 88 |
| 14 | 1.000 | La | 0.8 | 0.5 | 0.7 | 0.1 | 1.5 | 1.29 | 30 | 8.9 | 90 |
| 15* | 1.000 | La | 0.8 | 0.7 | 0.7 | 0.1 | 1.81 | 1.95 | 10 | 7.4 | 49 |
| 16 | 1.000 | La | 0.4 | 0.3 | 0.7 | 0.1 | 1.45 | 1.25 | 30 | 8.8 | 92 |
| 17 | 1.000 | Sm | 0.8 | 0.3 | 0.7 | 0.1 | 1.35 | 1.27 | 30 | 8.7 | 89 |
| 18 | 1.000 | Nd | 0.8 | 0.3 | 0.7 | 0.1 | 1.41 | 1.29 | 30 | 8.5 | 92 |
| 19* | 0.995 | La | 0.8 | 0.3 | 1.5 | 0.1 | 1.71 | 1.80 | 10 | 7.6 | 47 |

*outside the scope of the present invention

Sample number 1 has a favorable insulation resistance log IR of 8.9, but has a low product yield of 58%. This is believed to be because, due to no ZrO$_2$ contained although the compounding molar ratio m is 1.020, the excessively compounded Sr was deposited in the grain boundary layer to interfere with the achievement of insulated crystal grain boundaries.

Sample number 2 has a favorable insulation resistance log IR of 8.8, but a low product yield of 61% for the same reason as in the case of sample number 1, because the molar content of ZrO$_2$ is low and 0.10 mol with respect to 100 mol of the Ti element while the compounding molar ratio m is 1.020.

Sample number 6 has an average crystal grain size of 1.75 μm, for this reason, undergoes a decrease in insulation resistance log IR to 7.8, and also has degraded ESD withstanding voltage, because the molar content of ZrO$_2$ is excessively 3.5 mol with respect to 100 mol of the Ti element. This is believed to be because the contribution of Sr deposited in the crystal layer to the achievement of finer crystal grains is reduced due to the excessive molar content of ZrO$_2$. In addition, the product yield is also as low as 51% in this case.

Sample number 7 has a favorable insulation resistance log IR of 8.5, but a low product yield of 59%, because the compounding molar ratio m is 1.025, which is greater than 1.020. This is believed to be because Zr failed to compensate for all of Sr, due to the compounding molar ratio m in excess of 1.020, in spite of 1.5 mol of Zr element contained with respect to 100 mol of the Ti element.

Sample number 8 has a favorable insulation resistance log IR of 8.9, but has a low product yield of 60% for the same reason as in the case of sample number 1, because ZrO$_2$ is not contained while the compounding molar ratio m is 1.010.

Sample number 10 undergoes a decrease in insulation resistance log IR to 7.5, and also has a low product yield of 48%, because of containing no Mn element.

Sample number 11 has a favorable insulation resistance log IR of 8.6, but a low product yield of 65%, because ZrO$_2$ is not contained while the compounding molar ratio m is 1.000.

Sample number 15 undergoes a decrease in ESD withstanding voltage to 10 kV, because the molar content of the Mn element is excessively 0.7 mol with respect to 100 mol of the Ti element. In addition, it has been determined that in this case, the average crystal grain size undergoes an increase to 1.81 μm, for this reason, the insulation resistance log IR also undergoes a decrease to 7.4, and furthermore, the product yield is as also low as 49%.

Sample number 19 undergoes coarsening of the average crystal grain size to 1.71 μm, a decrease in insulation resistance log IR to 7.6, and also a decrease in ESD withstanding voltage to 10 kV. This is believed to be because Sr for contributing to the achievement of finer crystal grains is not deposited in the crystal grain layer, due to the compounding molar ratio m of 0.995, which is less than 1.000. In addition, it has been determined that the product yield also undergoes a decrease to 47% in this case.

In contrast, sample numbers 3 to 5, 9, 12 to 14, and 16 to 18 all fall within the scope of the present invention, since the compounding molar ratio m is 1.000 to 1.020, the content of the Mn element as the acceptor element is 0.3 mol to 0.5 mol with respect to 100 mol of the Ti element, the content of the Zr element is 0.15 mol to 3.0 mol with respect to 100 mol of the Ti element, and the average crystal grain size is 1.50 μm or less. Thus, it has been determined that a desired laminate type semiconductor ceramic capacitor can be achieved which can ensure such insulation performance that can withstand the practical use adequately, with the insulation resistance log IR of 8.5 to 8.9 in spite of the low electrostatic capacitance of 1.15 nF to 1.31 nF, moreover, has the tremendously improved product yield of 85% to 92%, and is suitable for mass production with the ESD withstanding voltage of 30 kV or more.

A laminate type semiconductor ceramic capacitor with varistor functionality can be achieved which allows for an improvement in product yield while ensuring such insulation performance that can withstand the practical use, and is suitable for mass production with a favorable ESD withstanding voltage.

DESCRIPTION OF REFERENCE SYMBOLS

1 component body (laminated sintered body)
1*a*-1*g* semiconductor ceramic layer
2, 2*a*2*f* internal electrode
3*a*, 3*b* external electrode

The invention claimed is:

1. A laminate type semiconductor ceramic capacitor with varistor functionality, the capacitor comprising:
    a laminated sintered body having a plurality of alternately stacked semiconductor ceramic layers and internal electrode layers, the semiconductor ceramic layers comprising a $SrTiO_3$ based grain boundary insulated semiconductor ceramic; and
    external electrodes on opposed ends of the laminated sintered body, the external electrodes electrically connected to respective sets of the internal electrode layers,
    wherein the semiconductor ceramic has a compounding molar ratio m between the Sr site and the Ti site to satisfy $1.000 \leq m \leq 1.020$, has a donor element present as a solid solution in crystal grains, has an acceptor element present in a grain boundary layer in a range of 0.5 mol or less and greater than 0 mol with respect to 100 mol of the Ti element, contains a Zr element in a range of 0.15 mol or more and 3.0 mol or less with respect to 100 mol of the Ti element, and the crystal grains are 1.5 µm or less in average grain size.

2. The laminate type semiconductor ceramic capacitor with varistor functionality according to claim 1, wherein the capacitor contains the acceptor element in the range of 0.3 mol to 0.5 mol with respect to 100 mol of the Ti element.

3. The laminate type semiconductor ceramic capacitor with varistor functionality according to claim 1, wherein the acceptor element contains at least one element of Mn, Co, Ni, and Cr.

4. The laminate type semiconductor ceramic capacitor with varistor functionality according to claim 1, wherein the donor element contains at least one element of La, Nd, Sm, Dy, Nb, and Ta.

5. The laminate type semiconductor ceramic capacitor with varistor functionality according to claim 4, wherein the capacitor contains the donor element in a range of 0.2 mol to 1.2 mol with respect to 100 mol of the Ti element.

6. The laminate type semiconductor ceramic capacitor with varistor functionality according to claim 4, wherein the capacitor contains the donor element in a range of 0.4 mol to 1.0 mol with respect to 100 mol of the Ti element.

7. The laminate type semiconductor ceramic capacitor with varistor functionality according to claim 1, wherein the capacitor contains the donor element in a range of 0.2 mol to 1.2 mol with respect to 100 mol of the Ti element.

8. The laminate type semiconductor ceramic capacitor with varistor functionality according to claim 1, wherein the capacitor contains the donor element in a range of 0.4 mol to 1.0 mol with respect to 100 mol of the Ti element.

9. The laminate type semiconductor ceramic capacitor with varistor functionality according to claim 1, wherein the capacitor contains a low-melting point oxide in the range of 0.1 mol or less with respect to 100 mol of the Ti element.

10. The laminate type semiconductor ceramic capacitor with varistor functionality according to claim 9, wherein the low-melting point oxide includes $SiO_2$.

11. A method for manufacturing a laminate type semiconductor ceramic capacitor with varistor functionality, with the use of a $SrTiO_3$ based grain boundary insulated semiconductor ceramic, the method comprising:
    preparing a calcined powder such that a ceramic raw material containing a donor compound is weighed so that a compounding molar ratio m between a Sr site and a Ti site falls within a range of $1.000 \leq m \leq 1.020$, subjected to mixing and grinding, and then calcined;
    preparing a heat-treated powder such that an acceptor compound is weighed for 0.5 mol or less and greater than 0 mol with respect to 100 mol of the Ti element, a Zr compound is weighed for 0.15 mol or more and 3.0 mol or less with respect to 100 mol of the Ti element, and the Zr compound and the acceptor compound are mixed with the calcined powder and subjected to a heat treatment;
    forming a laminated body such that the heat-treated powder is formed into ceramic green sheets, and internal electrode layers and the ceramic green sheets are then alternately stacked; and
    subjecting the laminated body to a primary firing treatment in a reducing atmosphere, and then to a secondary firing treatment in one of a reducing atmosphere, the atmosphere, or an oxidizing atmosphere.

12. The method for manufacturing a laminate type semiconductor ceramic capacitor with varistor functionality according to claim 11, wherein a calcination temperature is higher than a firing temperature in the primary firing treatment.

13. The method for manufacturing a laminate type semiconductor ceramic capacitor with varistor functionality according to claim 11, wherein the acceptor element is in the range of 0.3 mol to 0.5 mol with respect to 100 mol of the Ti element.

14. The method for manufacturing a laminate type semiconductor ceramic capacitor with varistor functionality according to claim 11, wherein the acceptor element contains at least one element of Mn, Co, Ni, and Cr.

15. The method for manufacturing a laminate type semiconductor ceramic capacitor with varistor functionality according to claim 11, wherein the donor element contains at least one element of La, Nd, Sm, Dy, Nb, and Ta.

16. The method for manufacturing a laminate type semiconductor ceramic capacitor with varistor functionality according to claim 11, wherein the donor element is in a range of 0.2 mol to 1.2 mol with respect to 100 mol of the Ti element.

17. The method for manufacturing a laminate type semiconductor ceramic capacitor with varistor functionality according to claim 11, wherein the donor element is in a range of 0.4 mol to 1.0 mol with respect to 100 mol of the Ti element.

18. The method for manufacturing a laminate type semiconductor ceramic capacitor with varistor functionality according to claim 11, wherein the heat-treated powder contains a low-melting point oxide in the range of 0.1 mol or less with respect to 100 mol of the Ti element.

19. The method for manufacturing a laminate type semiconductor ceramic capacitor with varistor functionality according to claim 18, wherein the low-melting point oxide includes $SiO_2$.

* * * * *